(12) United States Patent
Meeker

(10) Patent No.: US 6,539,519 B1
(45) Date of Patent: Mar. 25, 2003

(54) SPATIAL CHARACTERISTIC AND LOGICAL HIERARCHY BASED MANNER FOR COMPACTLY STORING IC DESIGN DATA AND RELATED OPERATIONS

(76) Inventor: Mark D. Meeker, 6259 Green Leaf La., Foresthill, CA (US) 95631

( * ) Notice: Subject to any disclaimer, the term of this patent is extended or adjusted under 35 U.S.C. 154(b) by 277 days.

(21) Appl. No.: 09/585,719

(22) Filed: May 31, 2000

(51) Int. Cl.$^7$ ............................................. G06F 17/50

(52) U.S. Cl. ............................. 716/2; 716/11; 716/4

(58) Field of Search ............................. 716/1, 2, 8, 9, 716/10, 11, 4, 18

(56) References Cited

U.S. PATENT DOCUMENTS

| | | | | |
|---|---|---|---|---|
| 4,829,446 A | * | 5/1989 | Draney | 364/488 |
| 5,050,091 A | * | 9/1991 | Rubin | 364/488 |
| 5,301,318 A | * | 4/1994 | Mittal | 395/600 |
| 5,440,720 A | * | 8/1995 | Baisuck et al. | 395/500 |
| 5,887,155 A | * | 3/1999 | Laidig | 395/500 |
| 5,974,419 A | | 10/1999 | Ashby | |
| 6,014,671 A | | 1/2000 | Castelli et al. | |

FOREIGN PATENT DOCUMENTS

EP          0 219 930 A2     4/1987

OTHER PUBLICATIONS

Lauzon et al., "Two–Dimensional Run–Encoding for Quadtree Representation," Computer Vision Graphics and Image Processing, Academic Press, Duluth, MA, US, vol. 30, No. 1, Apr. 1, 1985, pp. 56–69.

* cited by examiner

Primary Examiner—Matthew Smith
Assistant Examiner—Leigh Marie Garbowski
(74) Attorney, Agent, or Firm—Schwabe, Williamson & Wyatt, P.C.

(57) ABSTRACT

Descriptive data and truncated spatial data associated with elements of an IC design are stored into storage locations, employing a spatial characteristic and logical hierarchy based storage approach. The approach advantageously reduces the amount of storage locations required to store descriptive and spatial data of the IC design. To store the descriptive data and the truncated spatial data associated with an element, a position in the logical hierarchy for the element is first determined, using spatial data of the element. The descriptive data and truncated spatial data of the element (less the spatial data that can be inferred from the position), are then stored into the storage locations, based at least in part on the result of the determination. Accordingly, storage requirement for descriptive and spatial data of IC elements is advantageously reduced. The spatial characteristic and logical hierarchy based storage approach also advantageously facilitates efficient successive accesses to retrieve the stored descriptive and truncated spatial data of a selected one or selected ones of the elements for an operation. In various embodiments, the operation may include but not limited to displaying a portion of the IC design, searching for an element closest to a target point, extracting connectivity for a portion of the IC design, and isolating a short in the IC design.

36 Claims, 10 Drawing Sheets

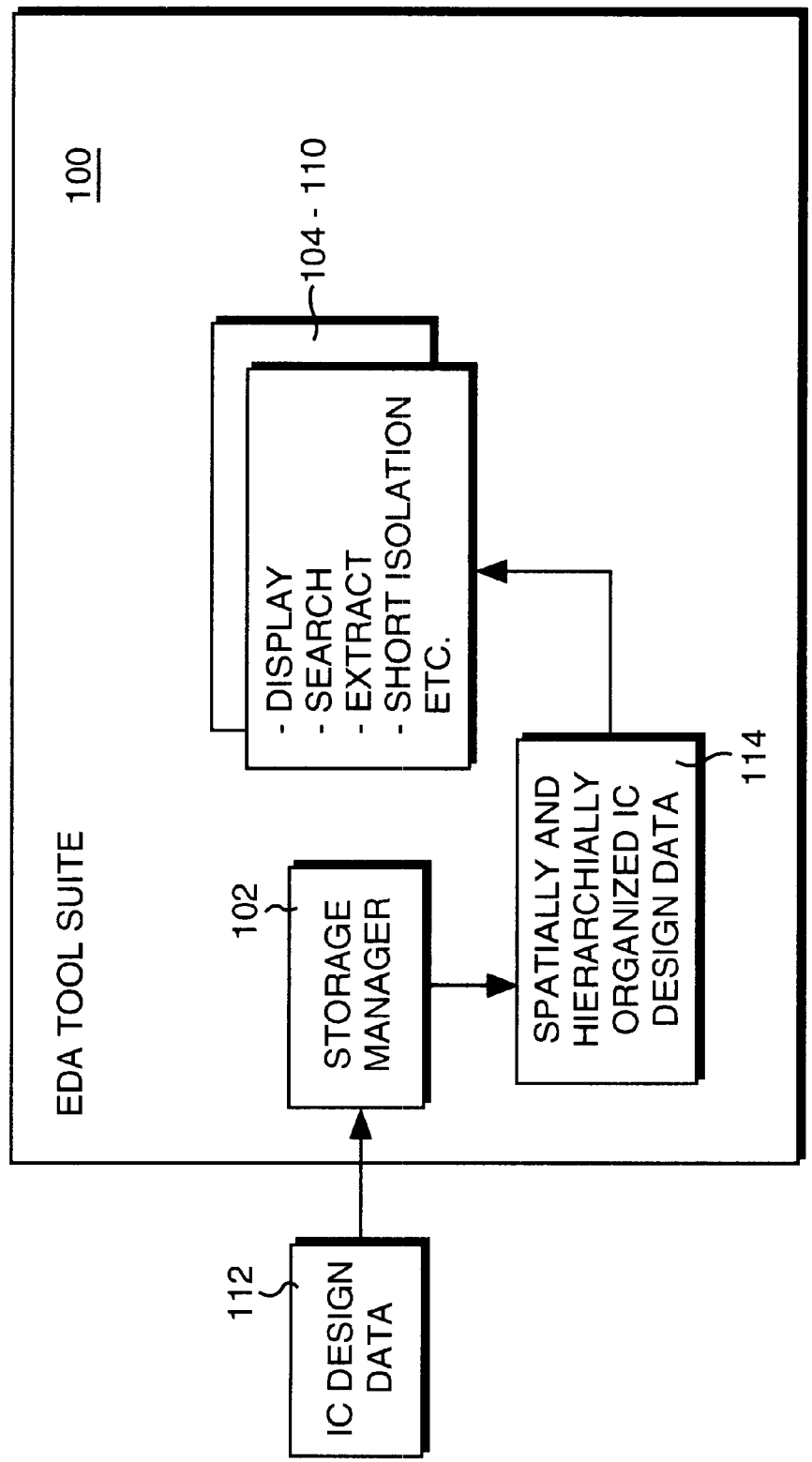

LEVEL 1   LEVEL 2   LEVEL 3

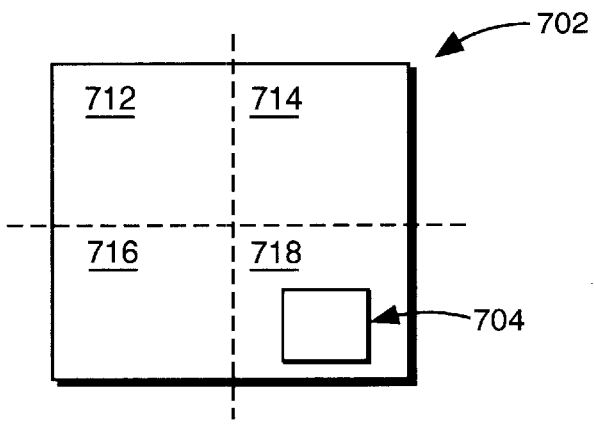
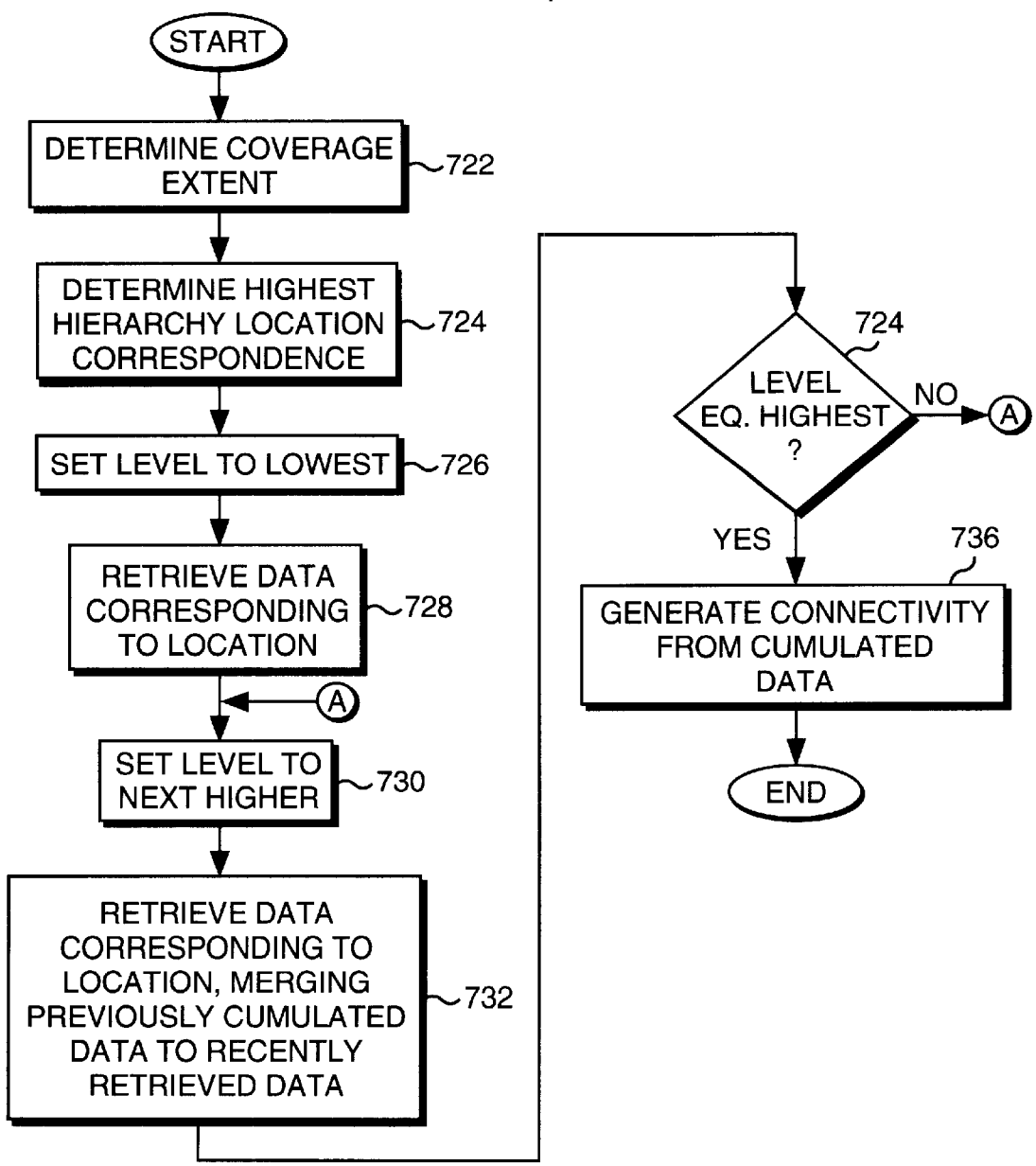

SPATIAL CHARACTERISTIC AND LOGICAL HIERARCHY BASED MANNER FOR COMPACTLY STORING IC DESIGN DATA AND RELATED OPERATIONS

BACKGROUND OF THE INVENTION

1. Field of the Invention

The present invention relates to the field of electronic design automation (EDA). More specifically, the present invention relates to a spatial characteristic and logical hierarchy based approach to compactly storing IC design data that reduces storage requirement and improves the efficiency of various common design operations.

2. Background Information

Over the years, with advances in process technology, the designs of integrated circuits (IC) have become increasingly complex. Long ago, IC designers turned to EDA tools to assist them in coping with the complexity of designing an IC, from design specification, synthesis, place and route, layout to verification (simulation and/or emulation). Recently, advances in process technology have made it possible to have ICs with multi-million transistors. The volume of data it takes to represent one of these IC designs has become so large, that it is a challenge for even the most powerful workstations to deliver reasonable performance (e.g. response time) for the IC designer. Even for workstations with very large amount of memory, capable of keeping most if not all of the IC design data in memory, it is still not uncommon to wait minutes if not hours for even some of the very basic operations to complete, e.g. like displaying a subset of an IC design, or searching for an element nearest to a target point, and so forth.

This trend of ever increasing complexity, and therefore larger and larger volume of design data to be stored and processed, is expected to continue without abatement. Thus, what is needed is an improved approach to storing IC design data, in particular, one that can reduce the storage requirement as well as be instrumental in improving the efficiency of various design operations, is desired.

SUMMARY OF THE INVENTION

In accordance with the present invention, descriptive data and truncated spatial data associated with elements of an IC design are stored into storage locations, employing a spatial characteristic and logical hierarchy based storage approach. The approach advantageously reduces the amount of storage locations required to store the IC design. To store the descriptive data and the truncated spatial data associated with an element, a position in the logical hierarchy for the element is first determined, using spatial data of the element. The descriptive and truncated spatial data of the element (less the spatial data that can be inferred from the storage position) are then stored into the storage locations, based at least in part on the result of the determination. As a result, storage requirement for descriptive and spatial data of IC elements is advantageously reduced. The spatial characteristic and logical hierarchy based storage approach also advantageously facilitates efficient successive accesses to retrieve the stored descriptive and truncated spatial data of a selected one or selected ones of the elements for an operation. In various embodiments, the operation may include but not limited to displaying a portion of the IC design, searching for an element closest to a target point, extracting connectivity for a portion of the IC design, and isolating a short in the IC design.

BRIEF DESCRIPTION OF DRAWINGS

The present invention will be described by way of exemplary embodiments, but not limitations, illustrated in the accompanying drawings in which like references denote similar elements, and in which:

FIG. 1 illustrates an overview of the present invention in accordance with one embodiment;

FIGS. 7a–7b together illustrate how connectivity for a subset of an IC design may be efficiently extracted under the present invention, in accordance with one embodiment;

DETAILED DESCRIPTION OF THE INVENTION

Figure 2A:
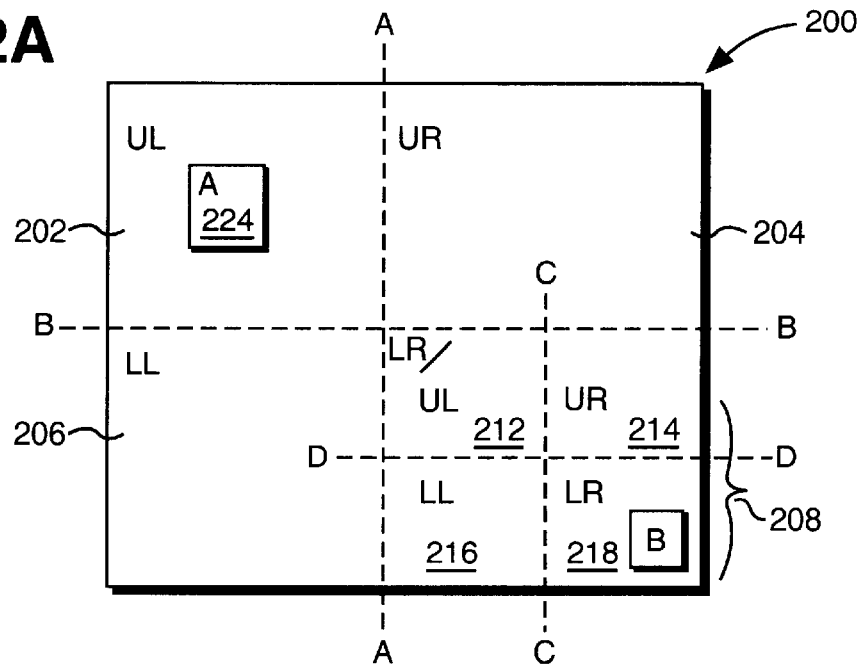
FIGS. 2a–2c illustrates the spatial characteristic and logical hierarchy based approach to storing IC design data by way of an example IC.

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as polygons, coordinates, and so forth. Also, parts of the description will also be presented in terms of operations performed by a computer system, using terms such as partitioning, determining, assigning, and the like. As well understood by those skilled in the art, these quantities take the form of electrical, magnetic, or optical signals capable of being stored, transferred, combined, and otherwise manipulated through electrical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Referring now to FIG. 1, wherein a block diagram illustrating an overview of the present invention in accordance with one embodiment is shown. As illustrated, EDA tool suite 100 includes in particular IC design data storage manager 102 (hereinafter simply storage manager), and a number of EDA tools 104–110, incorporated with the teachings of the present invention. For the illustrated embodiment, EDA tools 104–110 include display routine 104, search routine 106, connectivity extraction routine 108 and short isolation routine 110. Storage manager 102 reads design data 112 of an IC design, and stores the design data into storage locations in accordance with a spatial characteristic and logical hierarchy based approach 114. As a result, the amount of storage locations required to store the descriptive and spatial data of an IC design is advantageously reduced (to be explained more fully below). Furthermore, the organization under which the data are stored is particularly suitable for selective successive accesses by EDA tools, such as tools 104–110, to enable efficient performance of various design operations. For examples, in the first two cases, display routine 104 is able to efficiently make successive accesses to display a subset of an IC design, whereas search routine 106 is able to efficiently make successive accesses to locate an element of the IC design fitting certain search criteria closest to a target point. In the second two cases, connectivity extraction routine 108 is able to efficiently make successive accesses to extract connectivity for a portion of an IC design, whereas short isolation routine 110 is able to efficiently make successive accesses to isolate a short to an area of an IC design.

Figure 2B:
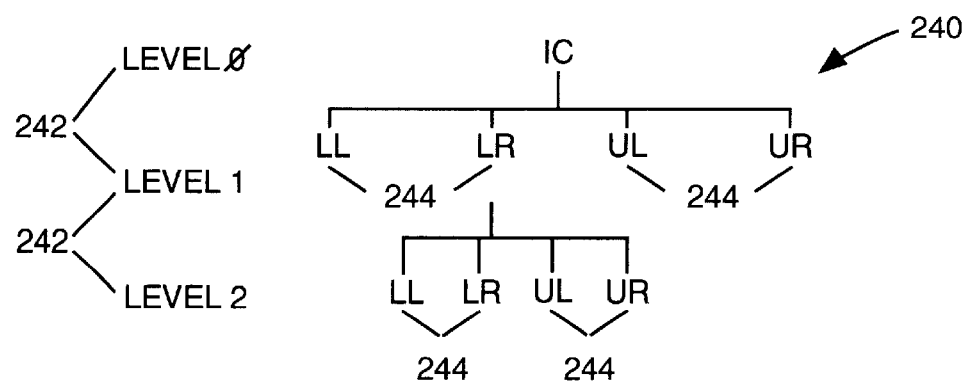
Figure 2C:
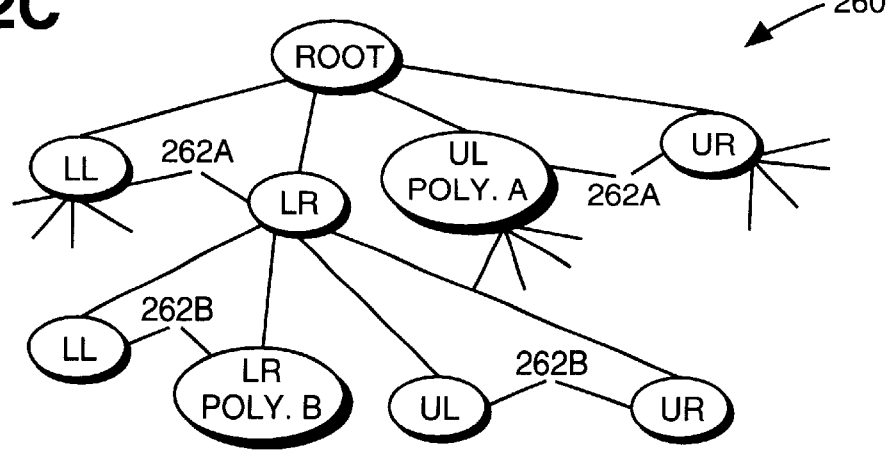

FIGS. 2a–2c illustrate the spatial characteristic and logical hierarchy based storage approach of the present invention with a simplified example IC. Shown in FIG. 2a is simplified example IC 200 having two polygons, A and B. Polygon A is the larger of the two polygons, generally disposed in the top upper left corner of IC 200, occupying about ¼ of the real estate of IC 200. Polygon B is the smaller of the two polygons, generally disposed in the lower right corner of IC 200, occupying about ¹⁄₁₆ of the real estate of IC 200.

Logical hierarchy 240 of FIG. 2b may be used to model the real estate regions of IC 200 formed through a predetermined manner of logical partitioning. Logical hierarchy 240 includes multiple levels 242. Within each level are locations 244. The highest level (level 0) corresponds to the entire IC. The constituting locations of each subsequent level (e.g. level 1 and level 2) correspond to the regions created from the predetermined manner of logically partitioning the immediate predecessor level. In other words, level 1 has four locations corresponding to the upper left (ul), upper right (ur), lower left (ll) and lower right (lr) regions 202–208 of IC 200, created by logically partitioning IC 200 along lines A—A and B—B. Level 2 has four sets of locations, each set having four locations corresponding to the upper left (ul), upper right (ur), lower left (ll) and lower right (lr) regions, created by logically partitioning a predecessor region, e.g. regions 212–218 of region 208.

Each polygon of example IC 200, by way of the smallest region that completely "holds" the polygon, may be correspondingly associated with a logical location of hierarchy 240. In other words, polygon A, by way of region 202, may be considered as being associated with location "ul" of level 1, whereas polygon B, by way of region 218, may be considered as being associated with location "lr" of level 2.

The (x, y) coordinates of any two points in IC 200 may share a number of common most significant bits (MSB), depending on how close or how far away the two points are from each other. Points within a smaller region, such as region 218, have a higher probability of being closer to each other. Accordingly, their coordinates have a higher probability of sharing more MSB. On the other hand, points within a larger region, such as region 202, have a higher probability of being farther away from each other. Accordingly, their coordinates have a higher probability of sharing less MSB. Thus, in general, the number of common MSB shared by the coordinates of two "extreme" points of a polygon has a correspondence to the level where its associated location in the logical hierarchy is located. Viewing this relationship from the inverse perspective, the MSB of the coordinates of the "extreme" points of an associated polygon may be inferred by the level to which its associated location is a member of.

FIG. 2c illustrates a tree like data structure 260 having node and leaf storage locations 262a and 262b. Node and leaf storage locations 262a and 262b have a 1:1 correspondence to the levels and locations of each level of logical hierarchy 240. Thus if tree like data structure 260 is employed to store the descriptive and spatial data of the polygons (or elements) of an IC design, in particular, with storage locations 262a and 262b being assigned to store the descriptive and spatial data of the polygons (or elements) in accordance with the positions of their associated locations in the various levels of logical hierarchy 240, storage for a substantial number of the higher order bits of the coordinates of their "extreme" points may be truncated and eliminated. These high order bits that are truncated and not stored may simply be inferred from the position of a storage location in data structure 260.

As those skilled in the art will appreciate, in real life, a multi-million transistor IC is constituted with hundreds of millions of polygons. IC 200 is a grossly simplified example. Nevertheless it illustrates the fundamental principles of the spatial characteristic and logical hierarchy based storage approach of the present invention to reduce the storage requirement for storing descriptive and spatial data of the elements of an IC design. In one embodiment, a logical hierarchy having 8 levels, with each level having 256 locations, is employed to model the real estate regions of an IC created in accordance with the above described manner of logical partitioning. Thus, at level 1, each location corresponds to a real estate region of 1/256 of the size of the IC, whereas at level 7, each location corresponds to a real estate region of $1/256 \times 256 \times 256 \times 256 \times 256 \times 256 \times 256$ of the size of the IC. The corresponding tree like data structure has a maximum of $1+256+256^2+256^3+256^4+256^5+256^6+256^7$ storage locations if all storage locations are used. However, not all storage locations will be used, as not all corresponding regions are "smallest" region holding a polygon of an IC design. Experience has shown that only a small to a moderate percentage of the potential storage locations will be used, and the substantial elimination of the necessity to store the MSB of the coordinates result in significant storage savings as well as processing performance. Moreover, as will be explained in more detail below, the size of the total storage may be even further reduced through storage of pointers to the actual descriptive and truncated spatial data (less the "inferable" spatial data), as opposed to the descriptive and truncated spatial data themselves. In any event, in alternate embodiments, other logical hierarchies with more or less levels, as well as more or less locations per level may also be employed to practice the present invention.

Figure 3:
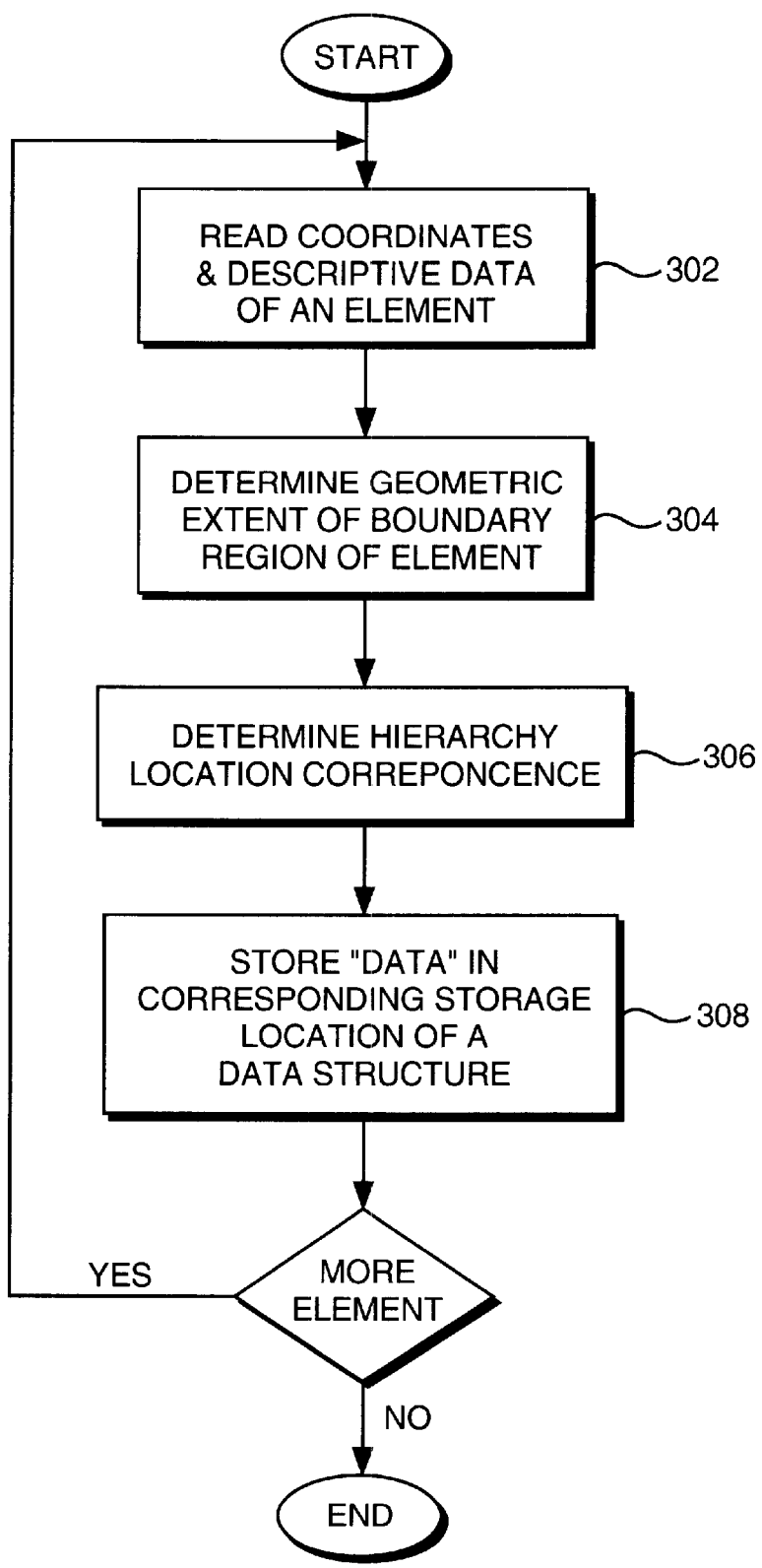
FIG. 3 illustrates the operational flow of IC design data storage manager of the present invention in accordance with one embodiment.
Figure 4:
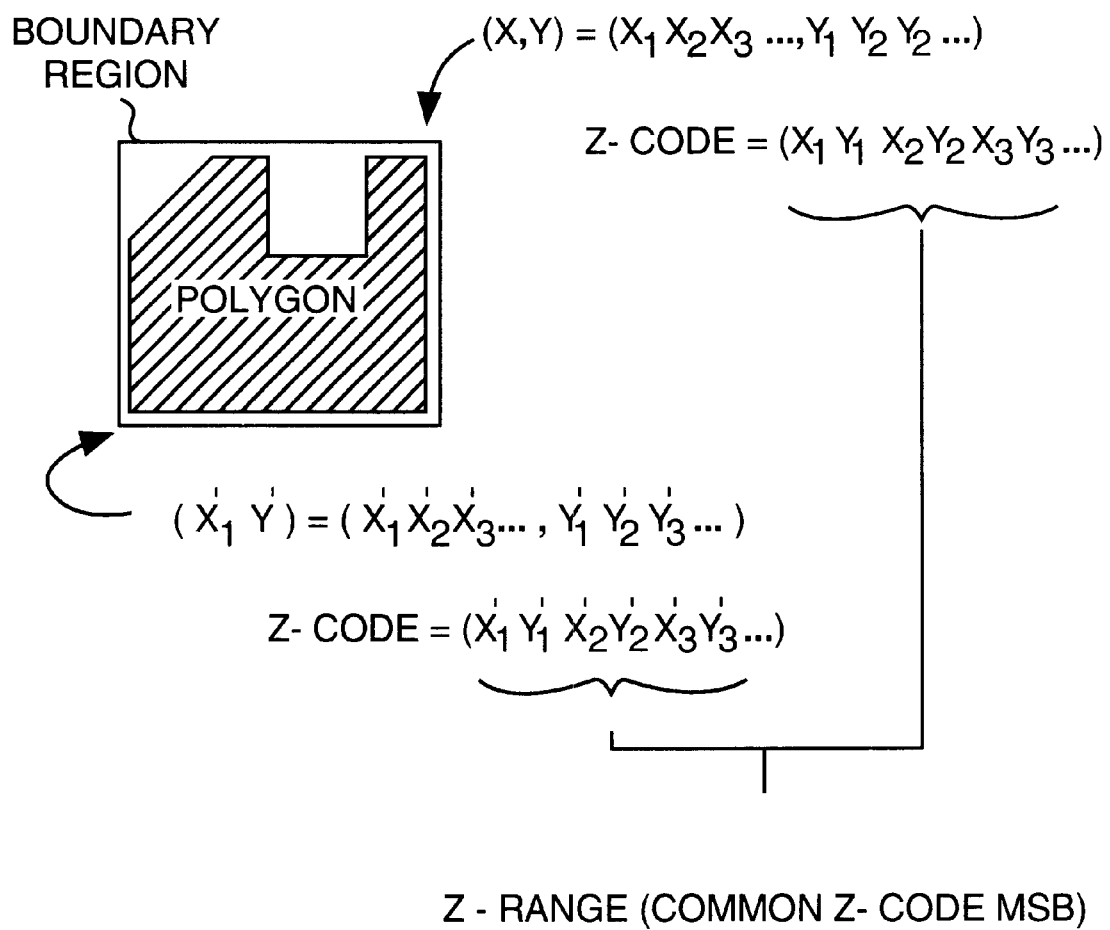
FIG. 4 illustrates the concept of characterizing the geometric extent of an element by its z-range in accordance with one embodiment.

FIG. 3 illustrates the relevant aspects of the operational flow of storage manager 102 in accordance with one embodiment. As illustrated, at 302, storage manager 102 reads the descriptive and spatial data associated with a polygon or element of an IC design. In one embodiment, the spatial data are the geometric coordinates of the defining critical points of the boundary region of the polygon or element. At 304, storage manger 102 determines the geometric extent of the element, using these coordinates. In one embodiment, storage manager 102 characterizes the geometric extent of an element in accordance with a computed "z-range". The z-range is the number of common MSB shared by the z-coded coordinates of the defining critical points of the boundary region of the element. The z-coded coordinate of a defining critical point is formed by correspondingly merging the x-bits (x1x2x3 . . . ) with the y-bits (y1y2y3 . . . ) to form z-bit pairs (z1z2z3 . . . ) where zi are bit pairs x1y1, x2y2, and so forth (see FIG. 4).

At 306, storage manger 102 determines the level and the location within the level of the logical hierarchy to which the element is to be considered as being associated with. In one embodiment, storage manager 102 first determines the hierarchy level in accordance with the z-range resolution of the element, and the location within the determined hierarchy level in accordance with the "non-common" bits. The z-range resolution is the amount of common MSBs. In one embodiment, the amount of common MSBs is determined by partitioning the set of bits into corresponding subsets and determining the number of partitions having identical bits. In one embodiment, the partitions are indexed incrementally, starting from the MSB, i.e. partitions 0, 1, 2, 3 and so forth, and the z-range resolution is determined in view of the highest index, which also denotes the "z-range bits". The size of the partitions may be any convenient size. Typically, it is selected in view of the data word size of the underlying system. At 308, storage manger 102 stores into a corresponding node/leaf storage location 260a/260b of tree like data structure 260, the descriptive data and the spatial data, including only the residual LSB of the coordinates of the defining critical points of boundary region of the element. In an alternate embodiment, since except for their actual locations, many constituting polygons or elements of an IC are alike, storage manager 102 stores a pointer pointing to a shared copy of the descriptive and truncated spatial data (less the "inferable" spatial data) instead, to further reduce storage requirement. The shared copy is created when an element of the particular kind is encountered for the first time. Thus, for this alternate embodiment, the operation further includes determining if an element's "type" is an element type being encountered for the first time. If so, a shared copy of the descriptive and spatial data for such an element is created for the first time.

Operations 302–308 are repeated as many times as necessary, until all elements of IC design have been processed and stored into the storage location in this manner, to reduce the amount of storage required to store the descriptive and spatial data of the elements of an IC design.

Figure 5A:
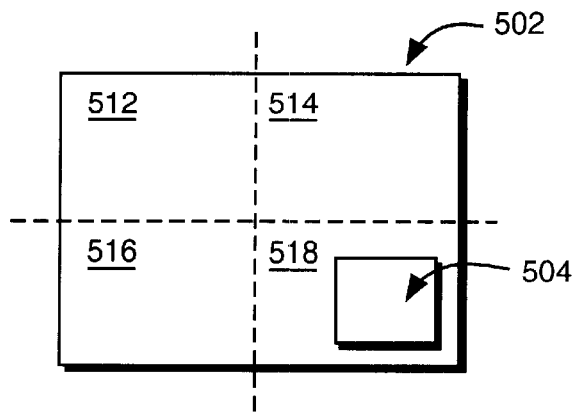
FIGS. 5a–5b together illustrate how display of a subset of an IC design may be efficiently performed under the present invention, in accordance with one embodiment.
Figure 5B:
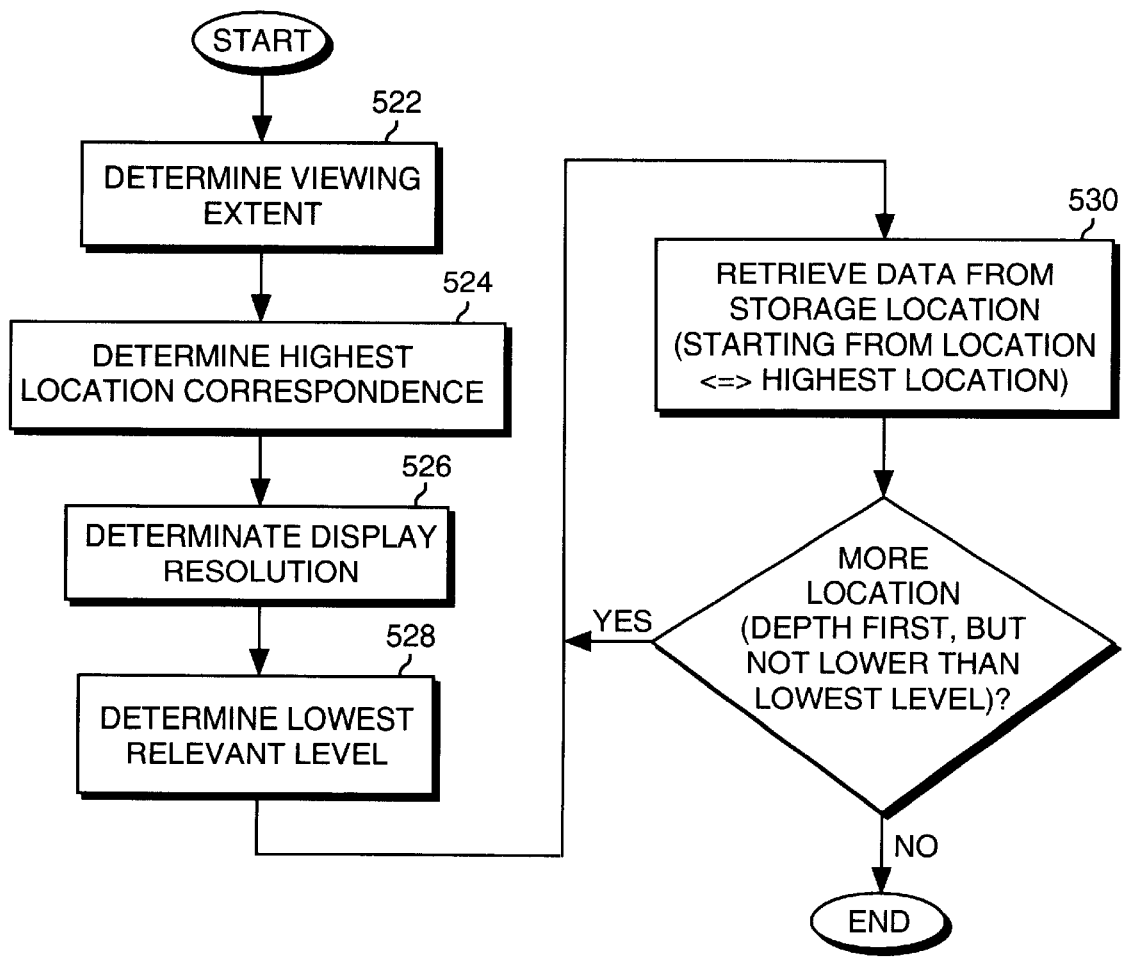

FIGS. 5a–5b together illustrate how displaying a subset of an IC design can be efficiently performed under the present invention, in accordance with one embodiment. Consider the example situation illustrated by FIG. 5a, where a user is interested in viewing subset 504 of example IC 502. The descriptive and spatial data of IC 502 had been processed and stored in accordance with the spatial characteristic and logical hierarchy based storage approach as described earlier. Accordingly, for this illustrative example, it is readily apparent that the descriptive and truncated spatial data stored in earlier described leaf/node storage locations 262a/262b corresponding to locations of the logical hierarchy "subordinated" to the top level locations corresponding to region 512–516 need not be retrieved and processed for displaying subset 504. Furthermore, depending on the size of the user's viewing window (which dictates the viewing resolution), it is also readily apparent that the descriptive and truncated spatial data stored in leaf/node storage locations 262a/262b corresponding to the "very low level" locations of the logical hierarchy "subordinated" to the top level location corresponding to region 518 also need not be retrieved and processed for displaying subset 504.

Accordingly, the process for retrieving the relevant data to display subset 504 may be efficiently performed as set forth in FIG. 5b, in accordance with one embodiment. At 522, display routine 104 first determines the viewing extent of requested subset 504. In one embodiment, the viewing extent is determined in the same z-code manner as the geometric extent of an element described earlier. At 524, based on the determined viewing extent, display routine 104 determines the highest location of the logical hierarchy corresponding to the node storage location, where data retrieval has to start. At 526, display routine 104 determines the display resolution based on the size of the user's viewing window (which may be obtained e.g. from the operating system of the host system on which the present invention is being practiced). At 528, based on the determined display resolution, display routine 104 determines the lowest level locations of the logical hierarchy corresponding to the most detailed node/leaf storage locations, beyond which, data retrieval are not necessary.

At 530, display routine 104 retrieves the stored descriptive and truncated spatial data to process for display, starting with descriptive and truncated spatial data stored in the storage location corresponding to the determined highest location of the logical hierarchy, and traversing tree like data structure 260, in one embodiment, depth first (but not going beyond the storage locations corresponding to the determined lowest level of the logical hierarchy). As a result, as alluded to earlier, a significant amount of unnecessary retrieval of the stored descriptive and truncated spatial data that are not relevant to the requested subset may be easily eliminated, allowing the requested display operation to be efficiently performed.

Figure 6A:
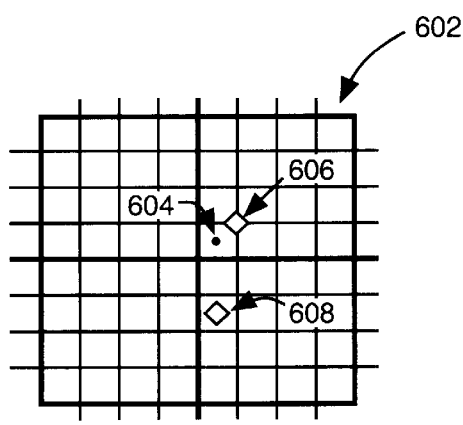
FIGS. 6a–6c together illustrate how locating an element fitting certain search criteria closest to a target point may be efficiently performed under the present invention, in accordance with one embodiment.
Figure 6B:
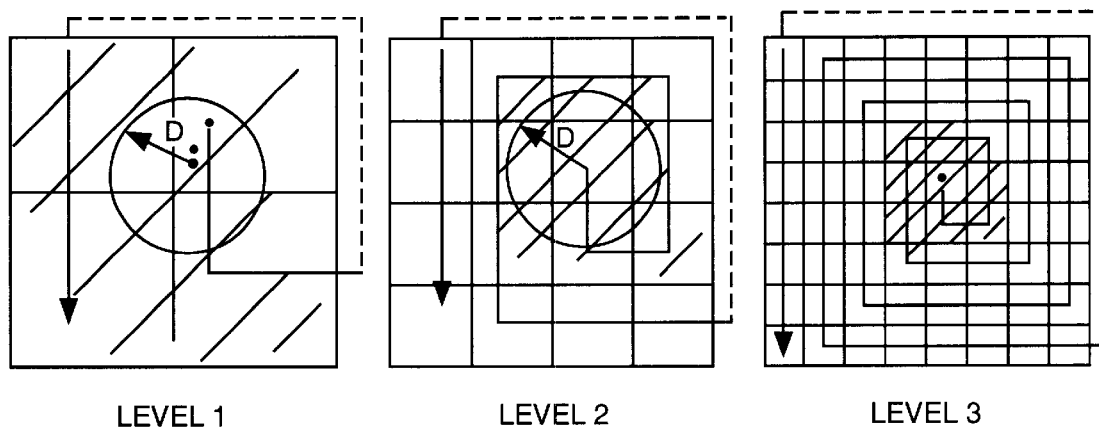
Figure 6C:
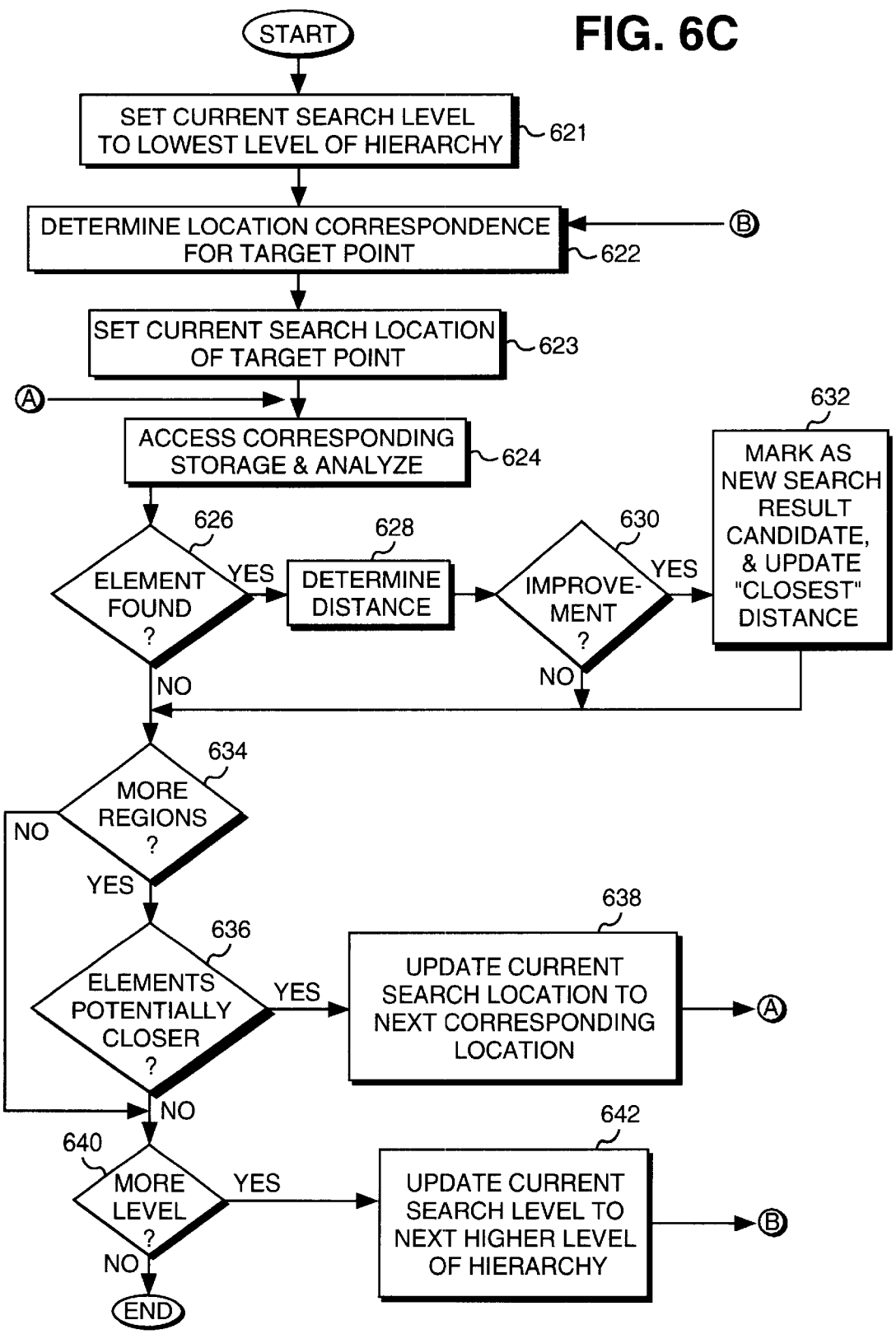

FIGS. 6a–6c together illustrate how locating an element fitting certain search criteria closest to a target point can be efficiently performed under the present invention, in accordance with one embodiment. Consider the example situation illustrated by FIG. 6a, where a user is interested in locating an element of a particular type closest to target point 604 of example IC 602. Example IC 602 includes at least polygons 606 and 608 of the particular element type, with polygon 606 being the "closer" of the two elements to target point 604. The descriptive and spatial data of IC 602 had been processed and stored in accordance with the spatial characteristic and logical hierarchy based storage approach as described earlier. Note that although polygon 606 and 608 are purposely illustrated as being similar, the descriptive and truncated spatial data of polygon 608 (or its pointer thereof) is stored in a storage location corresponding to a location disposed at a lower level of the logical hierarchy, when compared to the storage location for the descriptive and truncated spatial data of polygon 606. The reason for that is because polygon 606 straddles the logical partition lines, rendering the smallest region to completely "hold" polygon 608 to be the lower right $\frac{1}{16}$ region of the upper right $\frac{1}{4}$ of IC 602.

Thus, for the illustrative example, the search for the closest element of the particular type for target point 604 may be conducted efficiently in accordance with the example search paths illustrated in FIG. 6b. First, given target point 604 is located at the region corresponding the "lower left" location of the lowest level of the logical hierarchy (level 3), the 1/16 regions of IC 602 corresponding to the level 3 locations are searched first, in accordance with example "circular" search path 610a, starting with the 1/16 region where target point 604 is located. Next the 1/16 regions of IC 602 corresponding to the level 2 locations are searched, in accordance with example "circular" search path 610b, also starting with the 1/16 region where target point 604 is located. The process is repeated until regions of IC 602 corresponding to locations of all intermediate levels, including entire IC 602 itself have been searched.

Since the size of each region can be inferred from the level position of a location, the "circular" search path at any particular level can be readily effectuated through the location position values. Similarly, the distance of a member element to target point 604 may be easily estimated from the location and level positions. Furthermore, once a candidate element is identified in the examination of a region corresponding to a location at level j having distance d from target point 604, analyses for all regions corresponding to locations of the same level having distance from the target point greater than d may be skipped. For example, once polygon 608 is identified as the potential "closest" element of the particular type, analyses of all 1/16 regions corresponding to the unshaded locations of level 3 may all be skipped. Additionally, analyses for relevant regions corresponding to locations of higher levels may also be confined to areas within the distance d. Again as an example, once polygon 608 is identified as the potential "closest" element of the particular type, then analyses of the relevant 1/16 regions and 1/16 region of IC 602 may be confined to the reach of distance d from target point 604 as shown.

Accordingly, the process for searching for an element fitting certain search criteria closest to a target point of an IC design may be efficiently performed as set forth in FIG. 6c, in accordance with one embodiment. At 621, search routine 106 first sets the "current" search level to the lowest level of the logical hierarchy. At 622, search routine determines the location at the lowest level of the logical hierarchy corresponding to the region where the target point is located. At 623, search routine 106 sets the current search location for the current region to be examined to the determined location.

At 624, search routine 106 accesses a storage location corresponding to the "current" location, to determine if any element fitting the search criteria is disposed in the corresponding region. If an element fitting the search criteria is found at 626, its distance to the target point is determined, at 628. At 630, the determined distance is compared to the distance of a current search result candidate (if there is one). If the distance of the newly located element is closer to the target point, the newly located element is marked as the candidate search result, and the current "closest" distance is updated, at 632. In one embodiment, the distance is estimated based on the location and level position of the location corresponding to the accessed storage location.

Operations 624–632 are repeated as long as there are regions corresponding to locations of the current level, and elements within these regions are potentially closer to the target point than the current "closest" distance d of the current candidate search result, 634–636. Prior to repeating operations 624–632, the "current" location whose corresponding region is to be analyzed, is set to the "closest" neighboring location in accordance with a predetermined manner, 638. In one embodiment, the predetermined manner is the "circular" manner described above.

On the other hand, if there isn't a region that can potentially hold an element that is closer to the target point than the current candidate search result, search routine 106 determines if there are still higher level locations whose corresponding regions remain to be analyzed, 640. If the determination is affirmative, search routine 106 sets the "current" level to the next higher level, 642, and continues the process at operations 622 and 623, i.e. determining the corresponding location for the region containing the target point, at the current level, and setting the "current" location accordingly. If the determination is negative, the process terminates, and search routine 106 returns the current candidate search result as the search result.

FIGS. 7a–7b illustrate how connectivity for a subset of the IC design may be efficiently extracted under the present invention, in accordance with one embodiment. Consider the example situation illustrated by FIG. 7a, where a user is interested in extracting connectivity within subset 704 of example IC 702. The descriptive and spatial data of IC 702 had been processed and stored in accordance with the logical hierarchy based storage approach as described earlier. Accordingly, for this illustrative example, it is readily apparent that the descriptive and truncated spatial data stored in earlier described leaf/node storage locations 262a/262b corresponding to locations "subordinated" to the top level locations corresponding to region 712–716 need not be retrieved and processed for extracting connectivity within subset 704.

Thus, the process for retrieving the relevant data to extract connectivity within subset 704 may be efficiently performed as set forth in FIG. 7b, in accordance with one embodiment. At 722, extract routine 108 first determines the coverage extent of requested subset 704. In one embodiment, the coverage extent is determined in the same z-code manner as the geometric extent of an element described earlier. At 724, based on the determined coverage extent, extract routine 108 determines the highest location corresponding to the node storage location, where data retrieval is to stop. At 726–728, extract routine 108 sets the current level to the lowest level of the logical hierarchy, and retrieves the stored descriptive and truncated spatial data from storage locations corresponding to the locations of the "current" level. At 730–732, extract routine 108 increments the current level to the next higher level of the logical hierarchy, and retrieves the stored descriptive and truncated spatial data from storage locations corresponding to locations of the current level, and merges the retrieved descriptive and truncated spatial data into the cumulated data. At 734, extract routine 108 determines if the highest location has been reached. If the determination is negative, operations 730–732 are repeated. The operations are repeated until the determined highest location is reached. At such time, connectivity is extracted from the merged descriptive and truncated spatial data, 736. As a result, as alluded to earlier, a significant amount of unnecessary retrieval of the stored descriptive and truncated spatial data that are not relevant to the requested subset may be easily eliminated, allowing the requested extract operation to be efficiently performed.

Figure 8:
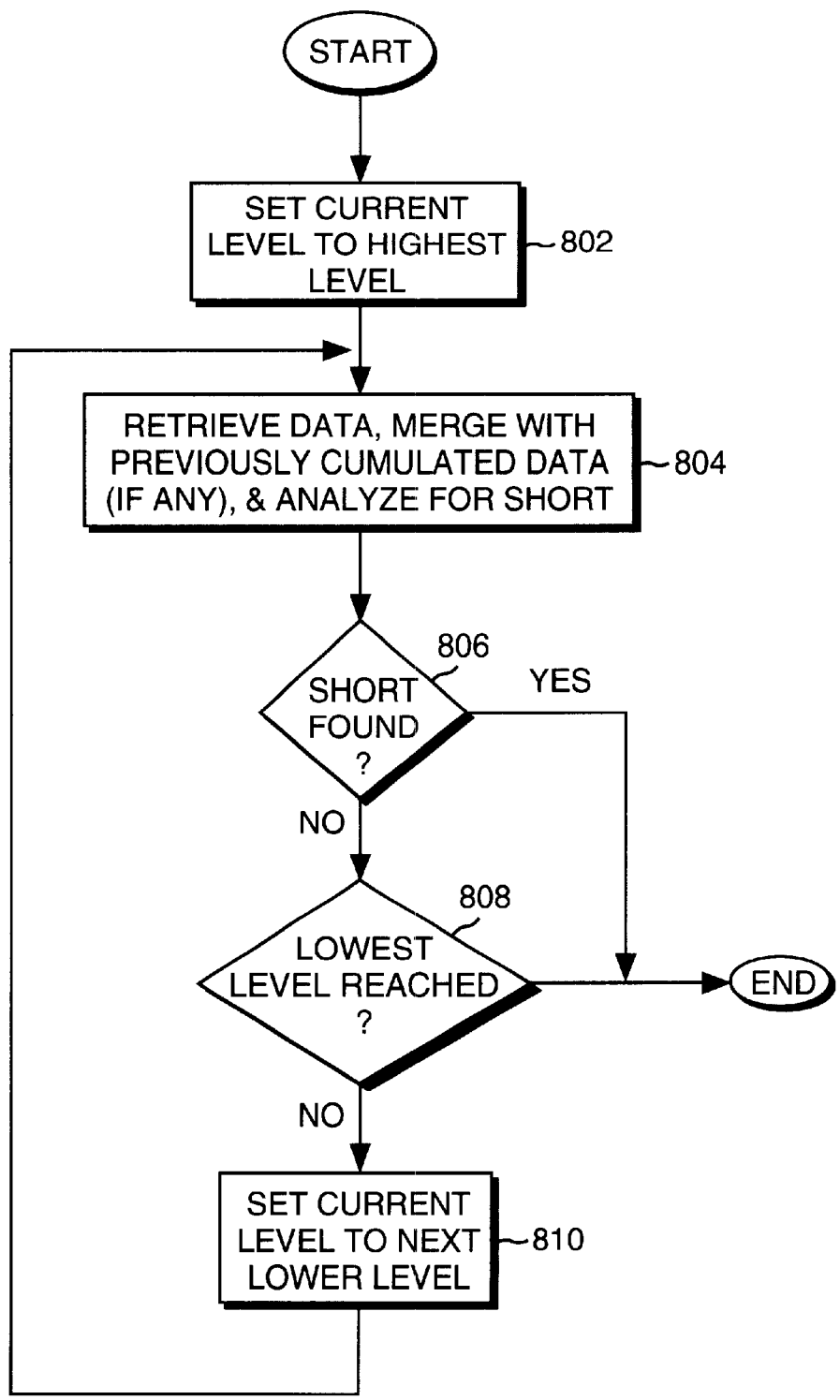
FIG. 8 illustrates how a short in an IC design may be efficiently isolated under the present invention, in accordance with one embodiment.

FIG. 8 illustrates how a short in an IC design data may be efficiently isolated under the present invention, in accordance with one embodiment. Again, the descriptive and spatial data of the IC had been processed and stored in accordance with the logical hierarchy based storage approach as described earlier. The short isolation process starts with the element located in the region associated with the highest location, i.e. the root location. At 802, short isolation routine 110 sets current level to the highest level of the logical hierarchy. At 804, short isolation routine 110 retrieves the stored descriptive and truncated spatial data from the storage location(s) corresponding to the location(s) of the current level, merges the retrieved data with cumulated data (if any), and examines if the element or elements are responsible for the short. If the determination is affirmative, the process terminates (yes branch of 806). The element or elements are responsible for the short. On the other hand, if the determination is negative (no branch of 806), short isolation routine 110 determines if the lowest level of the logical hierarchy has been reached, 808. If the determination is affirmative, the process also terminates (yes branch of 808). Otherwise, the current level is set to the next lower level, 810, and operations 804–808 are repeated. The operations are repeated until either the short is isolated, or until all data have been exhausted. As a result, as alluded to earlier, a short may be systematically and efficiently isolated.

Figure 9:
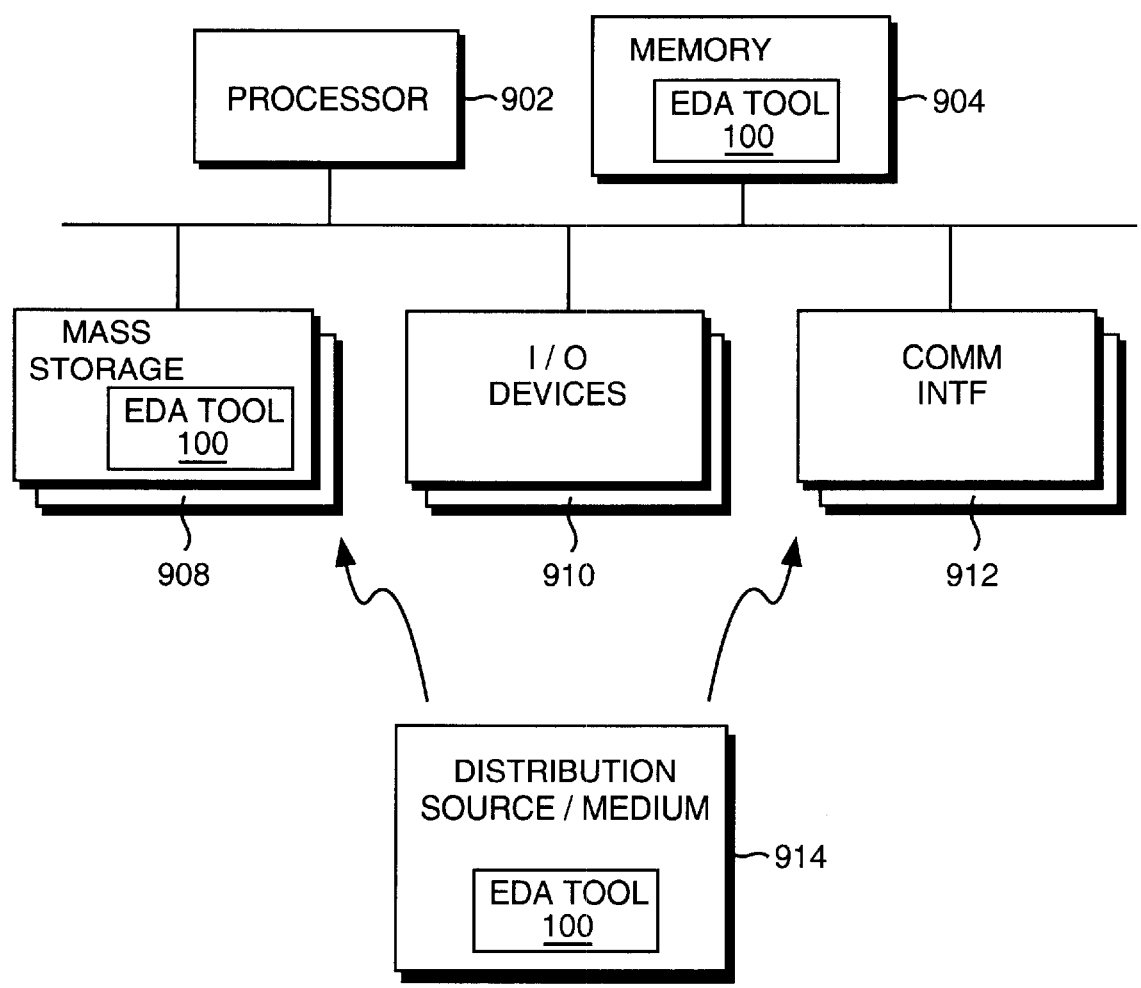
FIG. 9 illustrates an example computer system suitable to be programmed with the programming instructions implementing the EDA tool of FIG. 1.

FIG. 9 illustrates one embodiment of a computer system suitable for use to practice the present invention. As shown, computer system 900 includes processor 902 and memory 904 coupled to each other via system bus 906. Coupled to system bus 906 are non-volatile mass storage 908, such as hard disks, floppy disk, and so forth, input/output devices 910, such as keyboard, displays, and so forth, and communication interfaces 912, such as modem, LAN interfaces, and so forth. Each of these elements performs its conventional functions known in the art. In particular, system memory 904 and non-volatile mass storage 908 are employed to store a working copy and a permanent copy of the programming instructions implementing the above described teachings of the present invention. System memory 904 and non-volatile mass storage 906 may also be employed to store the IC designs. The permanent copy of the programming instructions to practice the present invention may be loaded into non-volatile mass storage 908 in the factory, or in the field, using distribution source/medium 914 and optionally, communication interfaces 912. Examples of distribution medium 914 include recordable medium such as tapes, CDROM, DVD, and so forth. In one embodiment, the programming instructions are part of a collection of programming instructions implementing EDA tool 800 of FIG. 8. The constitution of elements 902–914 are well known, and accordingly will not be further described.

In general, those skilled in the art will recognize that the present invention is not limited to the embodiments described. Instead, the present invention can be practiced with modifications and alterations within the spirit and scope of the appended claims. The description is thus to be regarded as illustrative, instead of restrictive on the present invention.

Thus, a method and an apparatus for efficiently storing IC design data in a compact or "compressed" manner, and performing various design operations have been described.

What is claimed is:

1. A computer implemented method comprising:
 receiving descriptive and spatial data associated with an element of an integrated circuit (IC) design;
 determining a position in a logical hierarchy for the element using the received spatial data; and
 storing the received descriptive data and a truncated version of the spatial data of the element based at least in part on the result of said determination, thereby reducing an amount of storage required to store descriptive and spatial data associated with the element.

2. The method of claim 1, wherein said determination of a position in the logical hierarchy comprises:

determining geometric extent of a boundary region of the element using the received spatial data; and
 determining a position in the logical hierarchy in accordance with the determined geometric extent of the boundary region of the element.

3. The method of claim 2, wherein said received spatial data are coordinates represented by corresponding pluralities of bits, and said determination of geometric extent comprises determining critical points of the boundary region of the element, and determining the number of common bits shared between spatially encoded representations of defining critical points of the boundary region of the element.

4. The method of claim 2, said determination of a position in the logical hierarchy in accordance with the determined geometric extent comprises determining a level of the logical hierarchy, and a location within the determined level, in accordance with the determined geometric extent.

5. The method of claim 4, wherein
 said received spatial data are coordinates represented in corresponding pluralities of bits;
 said determination of a level of the logical hierarchy in accordance with the determined geometric extent comprises determining a resolution value for the number of common bits shared between spatially encoded representations of defining critical points of the boundary region of the element; and
 said determination of a location within the determined level in accordance with the determined geometric extent comprises determining range values for the number of common bits shared between said spatially encoded representations of the defining critical points of the boundary region of the element.

6. The method of claim 1, wherein said storing of the received descriptive data and a truncated version of the spatial data comprises storing the descriptive data and the truncated version of the spatial data in a storage location of a data structure corresponding to the determined position of the logical hierarchy, the data structure being organized in accordance with said logical hierarchy.

7. The method of claim 1, wherein said storing of the received descriptive data and a truncated version of the spatial data comprises storing the descriptive data and the truncated version of the spatial data in a first storage location of a first data structure, and storing a pointer to the first storage location in a second storage location of a second data structure corresponding to the determined position of the logical hierarchy, the second data structure being organized in accordance with said logical hierarchy.

8. An apparatus comprising:
 a processor; and
 a first and a second plurality of storage locations coupled to the processor;
 wherein the first plurality of storage locations having stored therein a first plurality of programming instructions to be executed by the processor to receive descriptive and spatial data associated with a first element of an integrated circuit (IC) design, to determine a position in a logical hierarchy for the first element using said received spatial data, and to store the received descriptive data and a truncated version of the spatial data of the first element in said second plurality of storage locations based at least in part on the result of said determination, to reduce storage requirement for storing descriptive and spatial data of the first element.

9. The apparatus of claim 8, wherein the first plurality of programming instructions include a first subset to determine geometric extent of a boundary region of the first element using the received spatial data, and a second subset to determine a position in the logical hierarchy in accordance with the determined geometric extent of the boundary region of the first element.

10. The apparatus of claim 9, wherein said second subset determines a level of the logical hierarchy, and a location within the determined level, in accordance with the determined geometric extent of the boundary region of the first element.

11. The apparatus of claim 8, wherein the apparatus further having third plurality of storage locations coupled to the processor, and having stored therein a second plurality of programming instructions to be executed by the processor to perform a processing operation on descriptive and spatial data of a plurality of elements of the IC design, stored into said plurality of storage locations in the same manner as the descriptive and spatial data of said first element, the processing operation being performed in a manner tailored to said logical hierarchy based manner of storing the descriptive and spatial data of the elements of the IC design.

12. The apparatus of claim 11, wherein said processing operation is a processing operation selected from a group consisting of displaying a portion of the IC design, searching for an element closest to a target point, extracting connectivity for a portion of the IC design, and isolating a short in the IC design.

13. A computer implemented method comprising:
storing descriptive data and truncated spatial data associated with elements of an IC design into a plurality of storage locations, employing a spatial characteristic and logical hierarchy based storage approach;
successively accessing selected ones of the storage locations to retrieve the stored descriptive and truncated spatial data of selected ones of the elements to display a portion of the IC design, wherein the successive accesses are performed in a manner tailored to said spatial characteristic and logical hierarchy based manner of storing the descriptive and truncated spatial data of the elements of the IC design.

14. The method of claim 13, wherein said successively accessing comprises successively accessing storage locations corresponding to a first location of a first level of the logical hierarchy, and storage locations corresponding to locations subordinate to the first location but not beyond a second level of the logical hierarchy.

15. The method of claim 14, wherein the method further comprises determining a view extent of the portion of the IC design, and determining the first location of the first level of the logical hierarchy based at least in part on the determined view extent.

16. The method of claim 15, wherein the method further comprises determining a view resolution, and determining the second level of the logical hierarchy based at least in part on the determined view resolution.

17. An apparatus comprising:
a processor; and
a first, a second and a third plurality of storage locations coupled to the processor;
wherein the first plurality of storage locations having stored therein a first plurality of programming instructions to be executed by the processor to store descriptive data and truncated spatial data associated with elements of an IC design into the second plurality of storage locations, employing a spatial characteristics and logical hierarchy based storage approach, and the third plurality of storage locations having stored therein a second plurality of programming instructions to be executed by the processor to successively access selected ones of the second plurality of storage locations to retrieve the stored descriptive and truncated spatial data of selected ones of the elements to display a portion of the IC design, with the successive accesses being performed in a manner tailored to said spatial characteristic and logical hierarchy based manner of storing the descriptive and truncated spatial data of the elements of the IC design.

18. The apparatus of claim 17, wherein said second plurality of programming instructions, when executed, successively access storage locations corresponding to a first location of a first level of the logical hierarchy, and storage locations corresponding to locations subordinate to the first location but not beyond a second level of the logical hierarchy.

19. The apparatus of claim 18, wherein said second plurality of programming instructions, when executed, further determine a view extent of the portion of the IC design, and determine the first location of the first level of the logical hierarchy based at least in part on the determined view extent.

20. The apparatus of claim 19, wherein said second plurality of programming instructions, when executed, further determine a view resolution, and determine the second level of the logical hierarchy based at least in part on the determined view resolution.

21. A computer implemented method comprising:
storing descriptive data and truncated spatial data associated with elements of an IC design into a plurality of storage locations, employing a spatial characteristics and logical hierarchy based storage approach;
successively accessing selected ones of the storage locations to locate an element fitting certain search criteria closest to a target point, wherein the successive accesses are performed in a manner tailored to said spatial characteristic and logical hierarchy based manner of storing the descriptive data and truncated spatial data of the elements of the IC design.

22. The method of claim 21, wherein said successively accessing comprises successively accessing storage locations corresponding to locations of a level of the logical hierarchy in a predetermined manner, starting with a storage location corresponding to a location of the level associated with a region where the target point is located.

23. The method of claim 22, wherein said successively accessing further comprises terminating said successive access of storage locations corresponding to locations of the level of the logical hierarchy to be accessed in the predetermined manner, when the associated regions of the locations are disposed beyond a distance away from the target point.

24. The method of claim 22, wherein the method further comprises analyzing a region associated with a location correspond to an accessed storage location only up to a distance.

25. An apparatus comprising:
a processor; and
a first, a second and a third plurality of storage locations coupled to the processor;
wherein the first plurality of storage locations having stored therein a first plurality of programming instructions to be executed by the processor to store descriptive data and truncated spatial data associated with elements of an IC design into the second plurality of storage locations, employing a spatial characteristic and logical hierarchy based storage approach, and the third plurality of storage locations having stored therein a second plurality of programming instructions to be executed by the processor to successively access selected ones of said second plurality of storage locations to locate an element fitting certain search criteria closest to a target point, with the successive accesses being performed in a manner tailored to said spatial characteristic and logical hierarchy based manner of storing descriptive data and truncated spatial data of the elements of the IC design.

26. The apparatus of claim 25, wherein said second plurality of programming instructions, when executed, successively access storage locations corresponding to locations of a level of the logical hierarchy in a predetermined manner, starting with a storage location corresponding to location of the level associated with a region where the target point is located.

27. The apparatus of claim 26, wherein said second plurality of programming instructions, when executed, further terminate said successive access of storage locations corresponding to locations of the level of the logical hierarchy to be accessed in the predetermined manner, when the associated regions of the locations are disposed beyond a distance away from the target point.

28. The apparatus of claim 26, wherein said second plurality of programming instructions, when executed, further analyze a region associated with a location correspond to an accessed storage location only up to a distance.

29. A computer implemented method comprising:
storing descriptive data and truncated spatial data associated with elements of an IC design into a plurality of storage locations, employing a spatial characteristic and logical hierarchy based storage approach;
successively accessing selected ones of the storage locations to retrieve the stored descriptive data and truncated spatial data of selected ones of the elements to extract connectivity information for a portion of the IC design, wherein the successive accesses are performed in a manner tailored to said spatial characteristic and logical hierarchy based manner of storing descriptive data and truncated spatial data of the elements of the IC design.

30. The method of claim 29, wherein said successively accessing comprises successively retrieving descriptive data and truncated spatial data from storage locations corresponding to locations of a first level and a next higher level of the logical hierarchy, and merging the descriptive and truncated spatial data retrieved from storage locations corresponding to locations of the first level into descriptive and truncated spatial data retrieved from storage locations corresponding to locations of the next higher level of the logical hierarchy.

31. An apparatus comprising:
a processor; and
a first, a second and a third plurality of storage locations coupled to the processor;
wherein the first plurality of storage locations having stored therein a first plurality of programming instructions to be executed by the processor to store descriptive data and truncated spatial data associated with elements of an IC design into the second plurality of storage locations, employing a spatial characteristic and logical hierarchy based storage approach, and the third plurality of storage locations having stored therein a second plurality of programming instructions to be executed by the processor to successively access selected ones of said second plurality of storage locations to retrieve the stored descriptive data and truncated spatial data of selected ones of the elements to extract connectivity information for a portion of the IC design, with the successive accesses being performed in a manner tailored to said spatial characteristic and logical hierarchy based manner of storing the descriptive and truncated spatial data of the elements of the IC design.

32. The apparatus of claim 31, wherein said second plurality of programming instructions, when executed, successively retrieve the descriptive data and truncated spatial data from storage locations corresponding to locations of a first level and a next higher level of the logical hierarchy, and merge the descriptive data and truncated spatial data retrieved from storage locations corresponding to locations of the first level into descriptive data and truncated spatial data retrieved from storage locations corresponding to locations of the next higher level of the logical hierarchy.

33. A computer implemented method comprising:
storing descriptive data and truncated spatial data associated with elements of an IC design into a plurality of storage locations, employing a spatial characteristic and logical hierarchy based storage approach;
successively accessing selected ones of the storage locations to retrieve the stored descriptive data and truncated spatial data of selected ones of the elements to isolate a short in the IC design, wherein the successive accesses are performed in a manner tailored to said spatial characteristic and logical hierarchy based manner of storing descriptive and truncated spatial data of the elements of the IC design.

34. The method of claim 33, wherein said successively accessing comprises successively retrieving descriptive data and truncated spatial data from storage locations corresponding to locations of a first level and a next lower level of the logical hierarchy, and merging the descriptive data and truncated spatial data retrieved from storage locations corresponding to locations of the first level into descriptive data and truncated spatial data retrieved from storage locations corresponding to locations of the next lower level of the logical hierarchy.

35. An apparatus comprising:
a processor; and
a first, a second and a third plurality of storage locations coupled to the processor;
wherein the first plurality of storage locations having stored therein a first plurality of programming instructions to be executed by the processor to store descriptive data and truncated spatial data associated with elements of an IC design into the second plurality of storage locations, employing a spatial characteristic and logical hierarchy based storage approach, and the third plurality of storage locations having stored therein a second plurality of programming instructions to be executed by the processor to successively access selected ones of said second plurality of storage locations to retrieve the stored descriptive data and truncated spatial data of selected ones of the elements to isolate a short in the IC design, with the successive accesses being performed in a manner tailored to said spatial characteristic and logical hierarchy based manner of storing descriptive and truncated spatial data of the elements of the IC design.

36. The apparatus of claim 35, wherein said second plurality of programming instructions, when executed, successively retrieve descriptive data and truncated from storage locations corresponding to locations of a first level and a next lower level of the logical hierarchy, and merge the descriptive data and truncated spatial data retrieved from storage locations corresponding to locations of the first level into descriptive data and truncated spatial data retrieved from storage locations corresponding to locations of the next lower level of the logical hierarchy.

* * * * *